United States Patent
Katsukura et al.

(10) Patent No.: US 9,746,504 B2
(45) Date of Patent: Aug. 29, 2017

(54) FAULT DETECTION DEVICE, FAULT DETECTION METHOD, AND PROGRAM

(71) Applicant: Mitsubishi Electric Corporation, Tokyo (JP)

(72) Inventors: Makoto Katsukura, Tokyo (JP); Masanori Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 75 days.

(21) Appl. No.: 14/648,291

(22) PCT Filed: Dec. 2, 2013

(86) PCT No.: PCT/JP2013/082340
§ 371 (c)(1),
(2) Date: May 29, 2015

(87) PCT Pub. No.: WO2014/087965
PCT Pub. Date: Jun. 12, 2014

(65) Prior Publication Data
US 2015/0309089 A1   Oct. 29, 2015

(30) Foreign Application Priority Data
Dec. 3, 2012   (JP) ................. 2012-264369

(51) Int. Cl.
*G01R 31/00* (2006.01)
*G01R 31/14* (2006.01)
(Continued)

(52) U.S. Cl.
CPC ....... *G01R 19/16547* (2013.01); *G01R 21/00* (2013.01); *G08B 21/0484* (2013.01); *G06Q 50/06* (2013.01)

(58) Field of Classification Search
CPC .. G01R 19/16547; G01R 21/00; G06Q 50/06; G08B 21/0484
(Continued)

(56) References Cited

U.S. PATENT DOCUMENTS

2011/0010106 A1* 1/2011 Katsukura .............. G01D 4/002
702/19

FOREIGN PATENT DOCUMENTS

JP   2000-292465 A   10/2000
JP   2001-330630 A   11/2001
(Continued)

OTHER PUBLICATIONS

International Search Report of the International Searching Authority mailed Jan. 7, 2014 for the corresponding international application No. PCT/JP2013/082340 (and English translation).

*Primary Examiner* — Amy He
(74) *Attorney, Agent, or Firm* — Posz Law Group, PLC

(57) ABSTRACT

A fault detection device comprises: a measurement data acquirer that acquires measurement data for current flowing on power supply lines that are connected to multiple electrical devices; a clusterer that classifies the measurement data for a past fixed period into multiple clusters based on at least one of frequency and phase with respect to an AC cycle; a pattern analyzer that analyzes each of the clusters for an appearance pattern of measurement data that satisfy a preset standard; and a fault determiner that determines the occurrence of a fault when measurement data is acquired that differs from the analyzed appearance pattern.

6 Claims, 15 Drawing Sheets

(51) Int. Cl.
*G01R 19/165* (2006.01)
*G01R 21/00* (2006.01)
*G08B 21/04* (2006.01)
*G06Q 50/06* (2012.01)

(58) Field of Classification Search
USPC .................................................. 324/500, 511
See application file for complete search history.

(56) References Cited

FOREIGN PATENT DOCUMENTS

| | | | |
|---|---|---|---|
| JP | 2001-357477 | A | 12/2001 |
| JP | 2002-109663 | A | 4/2002 |
| JP | 2003-009430 | A | 1/2003 |
| JP | 2007-048265 | A | 2/2007 |
| JP | 2007-183890 | A | 7/2007 |
| JP | 2008-107885 | A | 5/2008 |
| JP | 2008-112267 | A | 5/2008 |
| JP | 2009-043141 | A | 2/2009 |
| JP | 2011-043984 | A | 3/2011 |
| JP | 2011-076253 | A | 4/2011 |

* cited by examiner

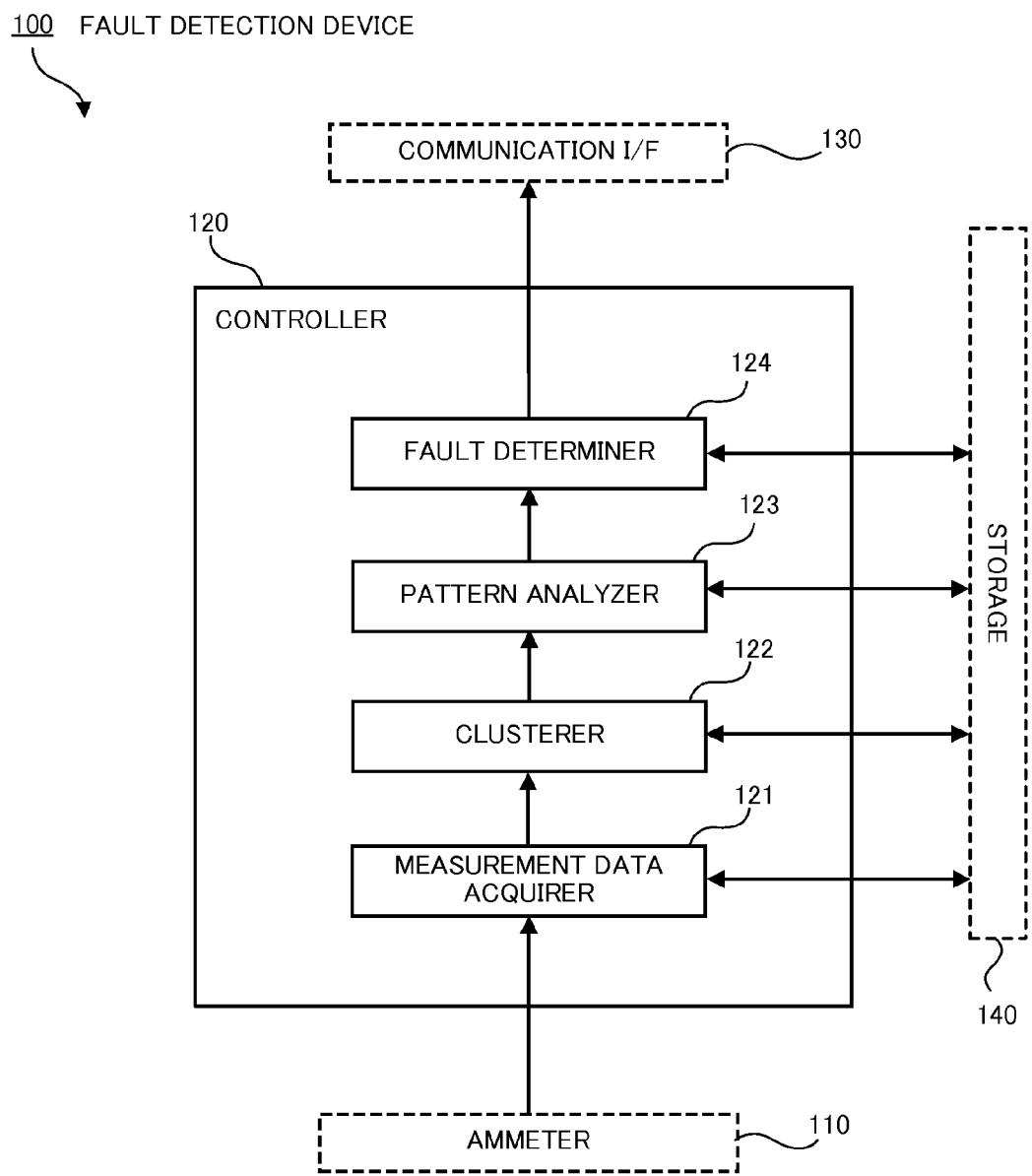

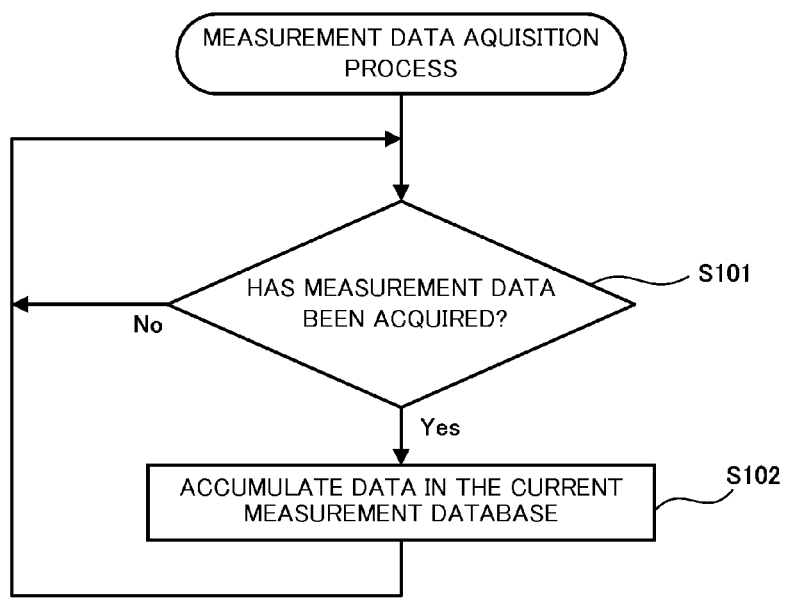

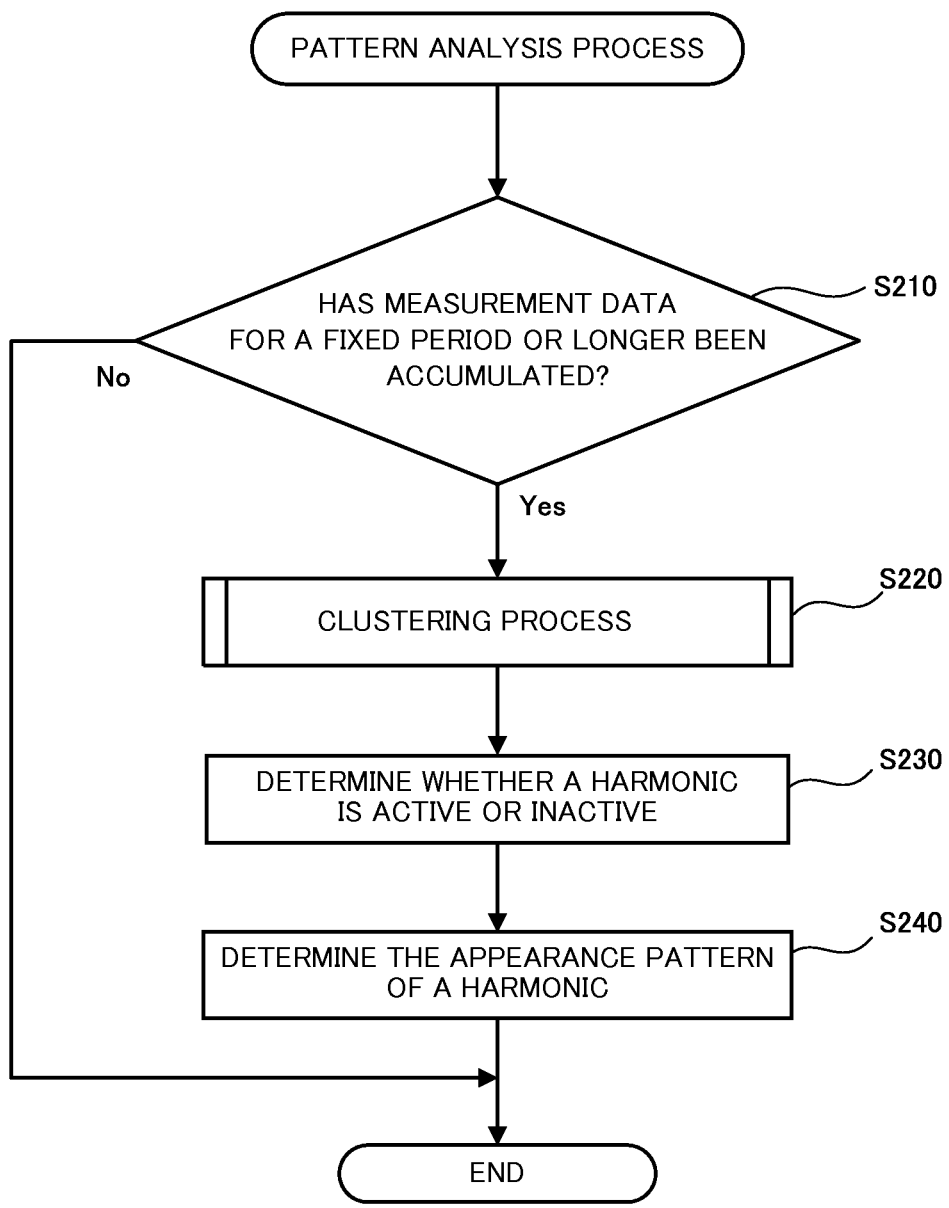

FIG. 11A

| | MEASUREMENT DATA | CLUSTER ID |
|---|---|---|
| DATA STRING 1 | MEASUREMENT DATA (LOW-FREQUENCY, PHASE t = 1) | 1 |
| DATA STRING 2 | MEASUREMENT DATA (LOW-FREQUENCY, PHASE t = 2) | |
| DATA STRING 3 | MEASUREMENT DATA (LOW-FREQUENCY, PHASE t = 3) | |
| ⋮ | | |
| DATA STRING 1200 | MEASUREMENT DATA (HIGH-FREQUENCY, PHASE t = 400) | |

FIG. 11B

| | MEASUREMENT DATA | CLUSTER ID |
|---|---|---|
| DATA STRING 1 | MEASUREMENT DATA (LOW-FREQUENCY, PHASE t = 1) | 1 |
| DATA STRING 2 | MEASUREMENT DATA (LOW-FREQUENCY, PHASE t = 2) | 1 |
| DATA STRING 3 | MEASUREMENT DATA (LOW-FREQUENCY, PHASE t = 3) | 1 |
| DATA STRING 4 | MEASUREMENT DATA (LOW-FREQUENCY, PHASE t = 4) | 2 |
| DATA STRING 5 | MEASUREMENT DATA (LOW-FREQUENCY, PHASE t = 5) | 2 |
| DATA STRING 6 | MEASUREMENT DATA (LOW-FREQUENCY, PHASE t = 6) | |
| ⋮ | | |
| DATA STRING 1200 | MEASUREMENT DATA (HIGH-FREQUENCY, PHASE t = 400) | |

FIG. 12

| CLUSTERING DATABASE | FREQUENCY | STARTING PHASE | ENDING PHASE | CLUSTER ID |
|---|---|---|---|---|
| RECORD 1 | HIGH FREQUENCY | 1 | 3 | 1 |
| ⋮ | ⋮ | ⋮ | ⋮ | ⋮ |
| RECORD 11 | HIGH FREQUENCY | 145 | 160 | 7 |
| RECORD 12 | HIGH FREQUENCY | 190 | 210 | 7 |
| RECORD 13 | HIGH FREQUENCY | 340 | 370 | 7 |
| RECORD 14 | MID FREQUENCY | 140 | 160 | 7 |
| RECORD 15 | MID FREQUENCY | 340 | 360 | 7 |
| RECORD 16 | LOW FREQUENCY | 140 | 160 | 7 |
| RECORD 17 | LOW FREQUENCY | 340 | 360 | 7 |
| ⋮ | ⋮ | ⋮ | ⋮ | ⋮ |

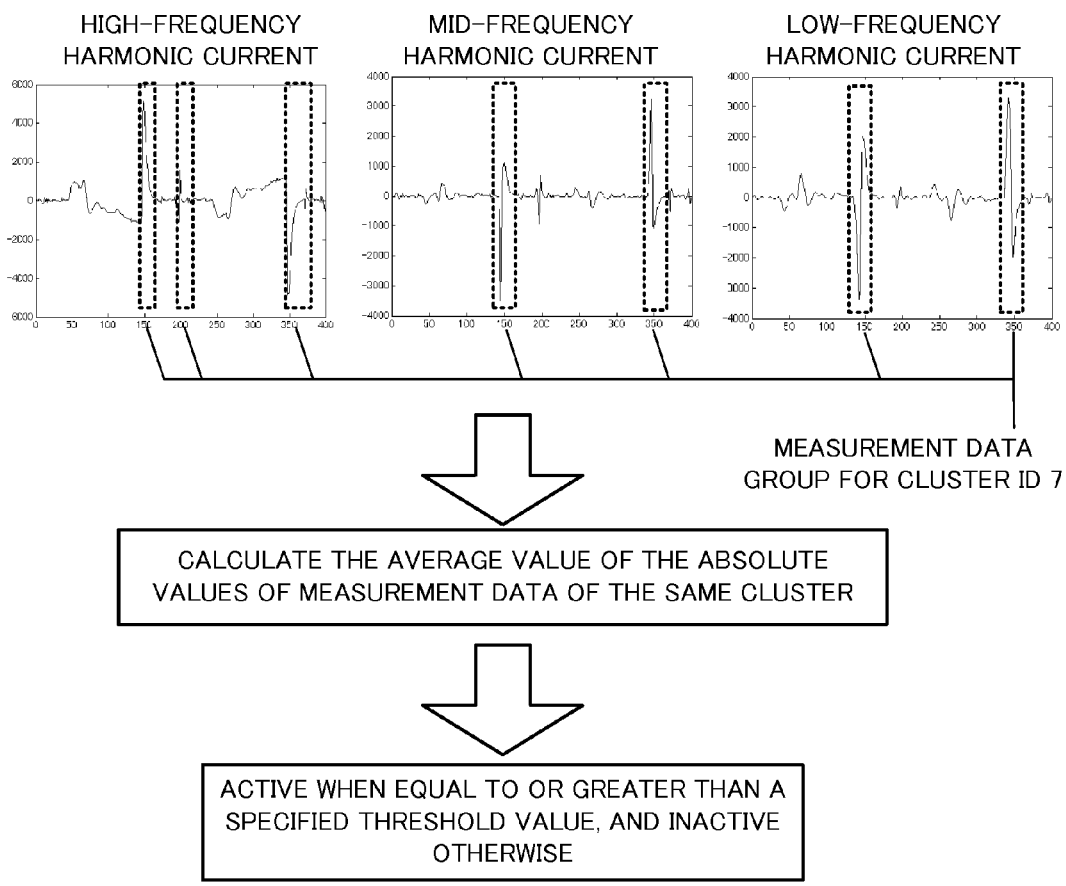

FAULT DETECTION DEVICE, FAULT DETECTION METHOD, AND PROGRAM

TECHNICAL FIELD

The present disclosure relates to a fault detection device, a fault detection method and a program.

BACKGROUND ART

There is a need for a system for remotely checking the safety of family members and close relatives. For example, Patent Literatures 1 to 7 disclose a device that performs a safety check of inhabitants based on a change in current that occurs during operation of an electrical device that is installed in a house. Moreover, Patent Literature 8 discloses a device that performs a safety check of inhabitants based on a change in the amount of electric power used.

CITATION LIST

Patent Literature

Patent Literature 1: Unexamined Japanese Patent Application Kokai Publication No. 2002-109663
Patent Literature 2: Unexamined Japanese Patent Application Kokai Publication No. 2000-292465
Patent Literature 3: Unexamined Japanese Patent Application Kokai Publication No. 2008-107885
Patent Literature 4: Unexamined Japanese Patent Application Kokai Publication No. 2007-48265
Patent Literature 5: Unexamined Japanese Patent Application Kokai Publication No. 2007-183890
Patent Literature 6: Unexamined Japanese Patent Application Kokai Publication No. 2009-43141
Patent Literature 7: Unexamined Japanese Patent Application Kokai Publication No. 2011-43984
Patent Literature 8: Unexamined Japanese Patent Application Kokai Publication No. 2008-112267

SUMMARY OF INVENTION

Technical Problem

As the number of electrical devices installed inside a house increases, the current waveform of the current flowing on the power supply lines becomes complex. Normally, many electrical devices are installed inside a house, so as disclosed in Patent Literatures 1 to 7, it is not possible to accurately detect when an inhabitant has a problem by a device that simply monitors only the electric current. Moreover, recently, there are many electrical devices that automatically start and stop without an inhabitant operating the device. Therefore, as disclosed in Patent Literature 8, it is not possible to accurately detect when an inhabitant has a problem simply by a device that monitors only the amount of electric power used.

Taking into considerations the problems above, the objective of the present disclosure is to provide a fault detection device, a fault detection method and a program that can accurately detect when an inhabitant has a problem.

Solution to Problem

The fault detection device of the present disclosure, comprises: measurement data acquisition means for acquiring measurement data for current flowing through power supply lines connected to multiple electrical devices; clustering means for classifying the measurement data for a past fixed period into multiple clusters based on at least one of frequency and phase with respect to an AC cycle; pattern analysis means for analyzing each of the clusters for an appearance pattern of the measurement data that satisfy a preset standard; and fault determination means for determining an occurrence of a fault when measurement data that differs from the analyzed appearance pattern is acquired.

Advantageous Effects of Invention

According to the present disclosure, a fault detection device, fault detection method and program capable of accurately detecting when an inhabitant has a problem can be provided.

BRIEF DESCRIPTION OF DRAWINGS

FIG. 5 is a function block diagram for explaining the functions of the controller that is illustrated in FIG. 2;
FIG. 6 is a flowchart for explaining a measurement data acquisition process;
FIG. 7 is a diagram for explaining a current measurement database that is stored in the storage illustrated in FIG. 2;
FIG. 8 is a flowchart for explaining a pattern analysis process;
FIG. 11A is a diagram for explaining a state in which data strings are classified into multiple clusters;
FIG. 11B is a diagram for explaining a state in which data strings are classified into multiple clusters;
FIG. 12 is a diagram for explaining a clustering database that is stored in the storage illustrated in FIG. 2;
FIG. 13 is a diagram for explaining a state in which measurement data for the same time and same cluster is extracted from the current measurement database;
FIG. 14 is a diagram for explaining an active determination database that is stored in the storage illustrated in FIG. 2.

DESCRIPTION OF EMBODIMENTS

In the following, an embodiment of the present disclosure will be explained while referencing the drawings.

When an electrical device is connected to an AC power supply, the current waveform does not become a nice sine wave, but becomes a deformed waveform that includes a harmonic component. Deformation of the waveform (in other words, the harmonic component that is included in the waveform) changes according to the operating state of the electrical device. Therefore, by analyzing the waveform of the electric current that flows inside a house, it is possible to check the operating state of electrical devices inside the house.

Figure 1:
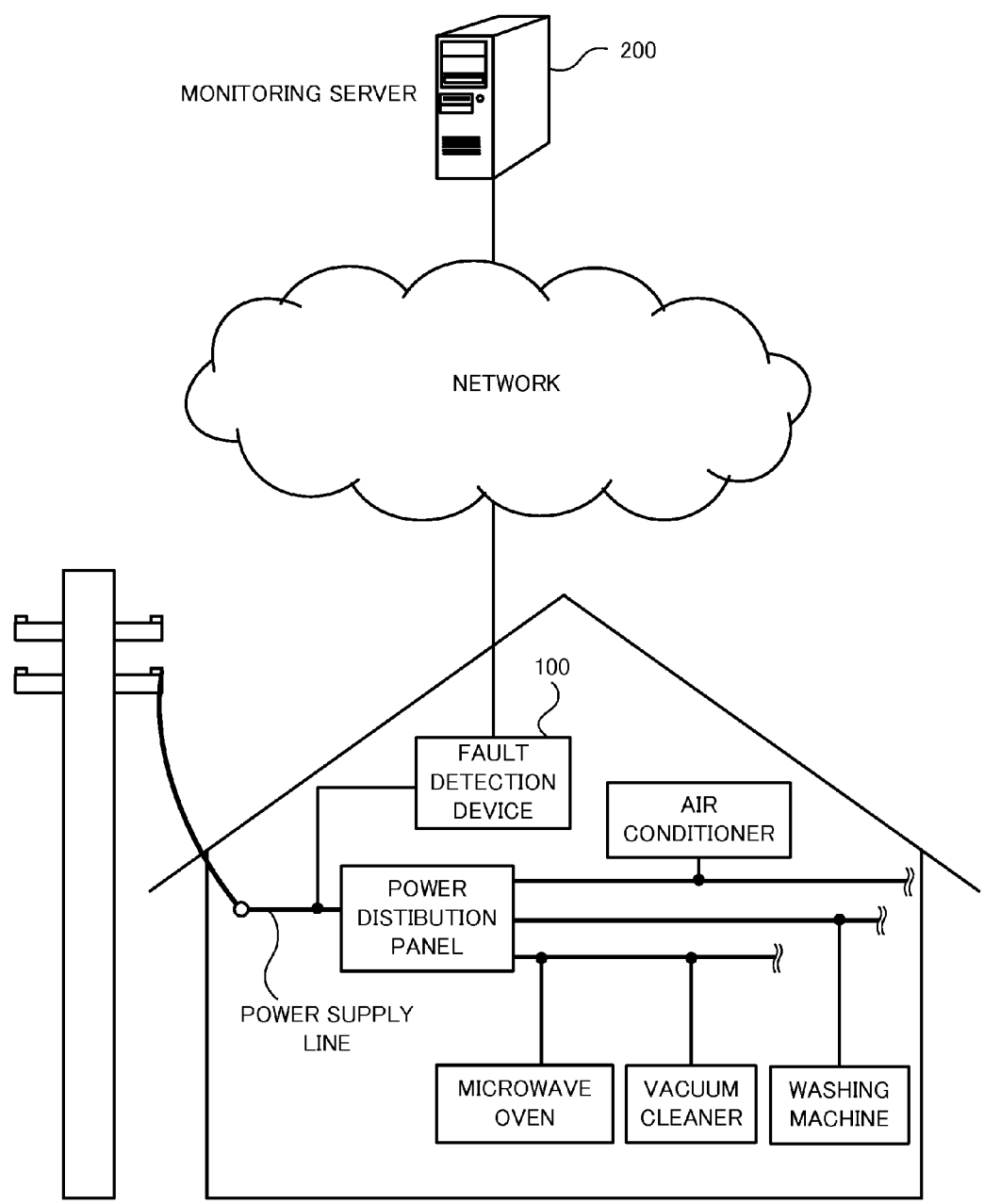
FIG. 1 is a drawing for explaining the installation state of a fault detection device of an embodiment of the present disclosure.

A fault detection device 100 of an embodiment of the present disclosure detects when an inhabitant has a problem based on the operating state of electrical devices that are identified by the waveform of current that is flowing inside the house. More specifically, the fault detection device 100 accumulates measurement data for current that flows on the main line (electric power supply line from the service entrance for the electric supply line to the power distribution panel such as illustrated in FIG. 1) inside the house that is directly or indirectly connected to multiple electrical devices. Then, the fault detection device 100 uses the accumulated measurement data to identify an operating pattern for electrical devices that are installed inside the house. The fault detection device 100 determines that a problem occurred when the operating state of an electrical device that is identified by the current waveform differs from the identified operating pattern, and notifies a monitoring server 200 in a remote location by way of a network. In the following this fault detection device 100 will be explained in detail.

Figure 2:
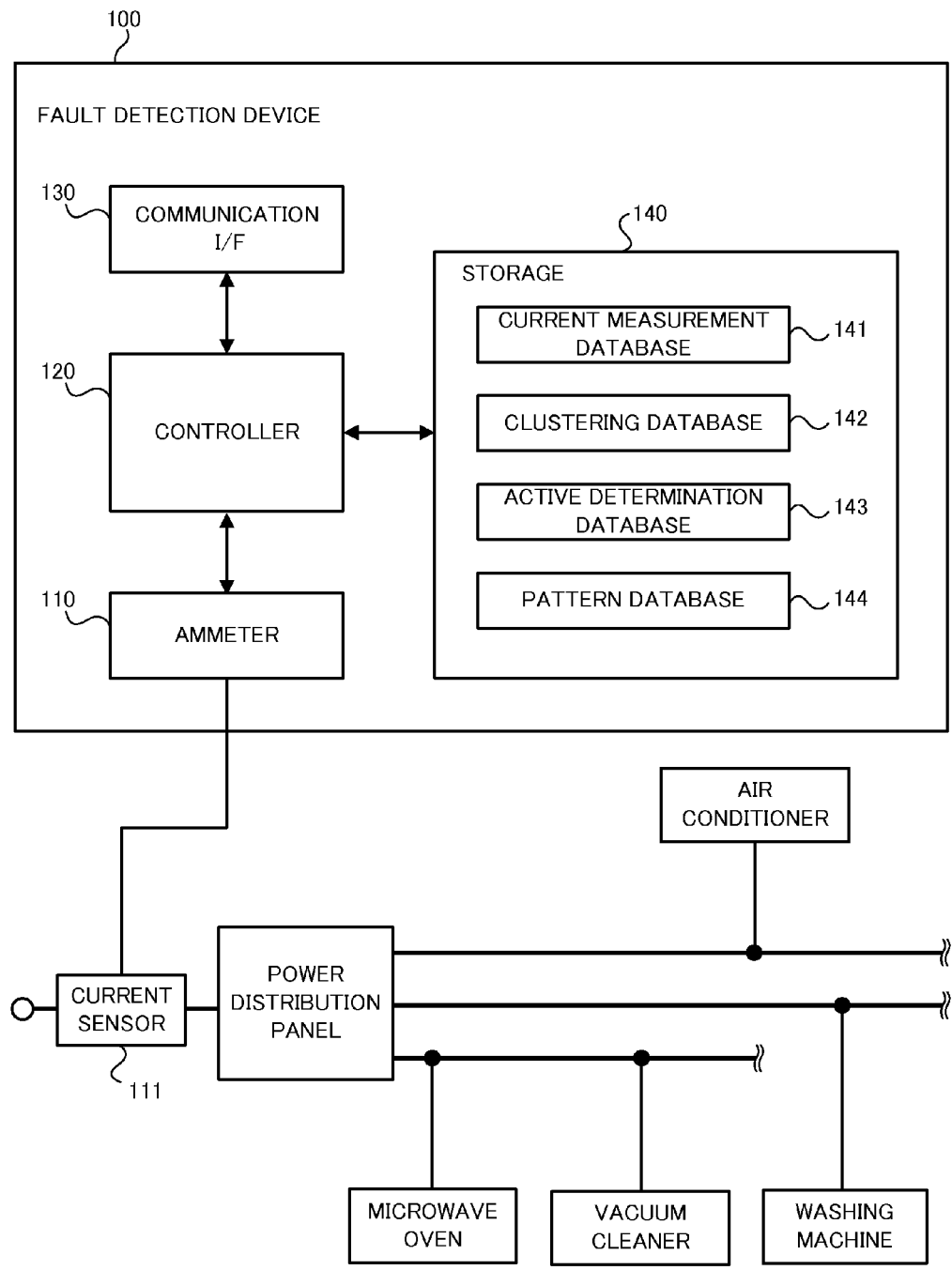
FIG. 2 is a block diagram of a fault detection device of an embodiment of the present disclosure.

The fault detection device 100, as illustrated in FIG. 2, comprises an ammeter 110, a controller 120, a communication interface 130 and a storage 140.

The ammeter 110 is a device for measuring the harmonic current that flows on the power supply line. In this embodiment, the "harmonic current" is current that does not include the fundamental frequency component (for example, 50 Hz or 60 Hz commercial frequency component), and not only includes current that comprises just the harmonic component of integral multiples of the fundamental frequency component, but also includes current that includes a noise component that occurs singly.

Figure 3:
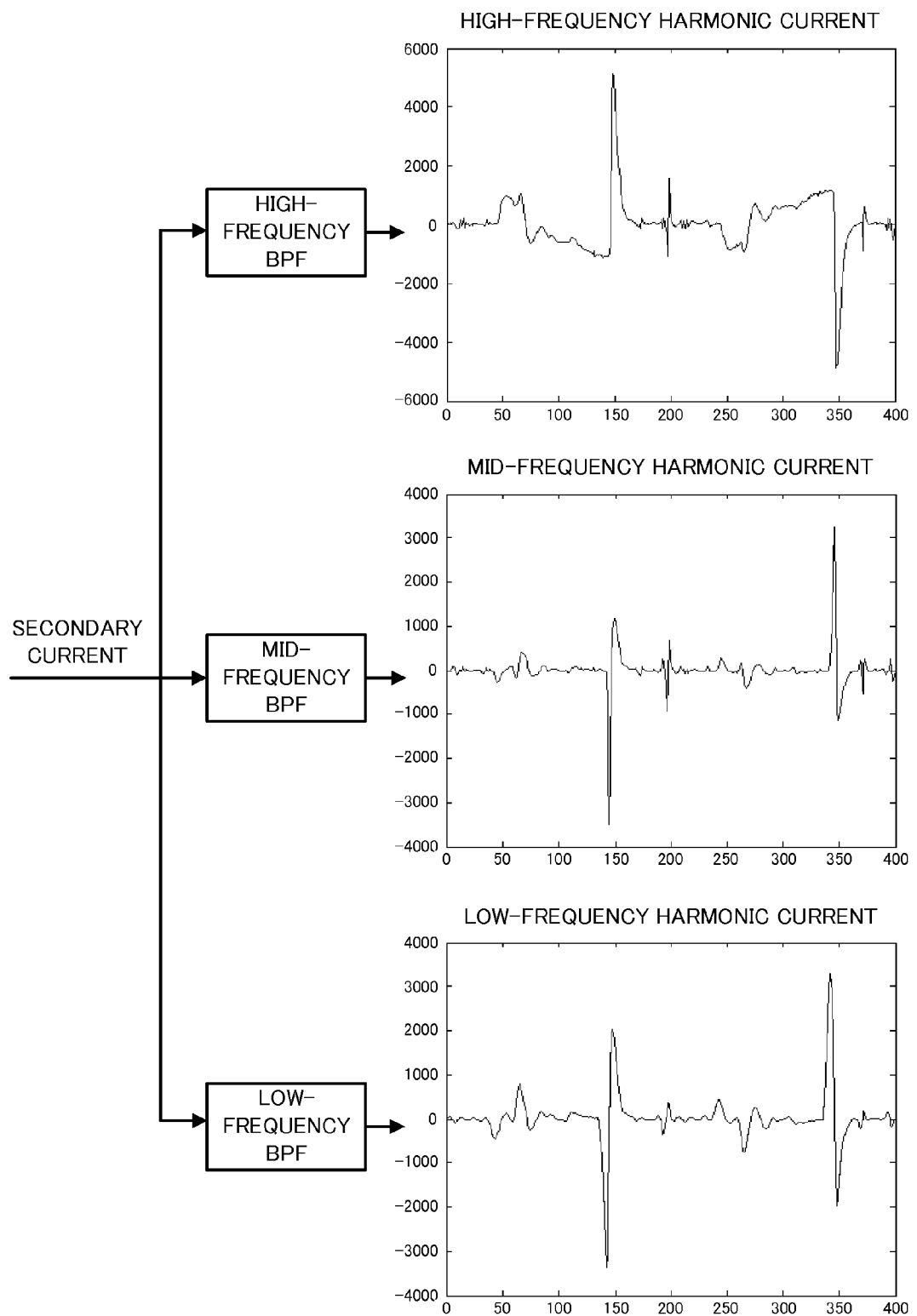
FIG. 3 is a diagram illustrating the state when the electric current measured by the ammeter in FIG. 2 is divided into three frequency bands.

The ammeter 110 comprises a load resistor, a filter circuit, an amplifier, an AD converter and a memory. The ammeter 110 is connected to a clamp type current sensor 111. The current sensor 111 is located on the main line inside the house (for example, as illustrated in FIG. 1, from the service entrance for the electric supply line to the power distribution panel) so that the total current of all of the electrical devices that are used inside the house can be observed at one location. The current sensor 111, for example, has a current transformer structure in which a coil is wound around an electromagnetic core, and generates a secondary current by transforming the current that flows on the power supply line with a current transformation ratio of 1 to 3000. The ammeter 110 uses three kinds of band-pass filters (hereafter referred to as "high-frequency BPF", "mid-frequency BPF" and "low-frequency BPF") to separate the generated secondary current into three kinds of harmonic currents (hereafter referred to as, "high-frequency harmonic current", "mid-frequency harmonic current" and "low-frequency harmonic current") having different frequency bands as illustrated in FIG. 3. Then, the ammeter 110 uses an AD converter to generate digital data for each of the three kinds of harmonic currents. As an example, the ammeter 110 measures harmonic current as described below.

The ammeter 110 converts fluctuation of the current to fluctuation of the voltage by passing the secondary current that was outputted from the current sensor 111 through a load resistor that has a resistance of tens of Ω to thousands of Ω. The ammeter 110 applies the high-frequency BPF, mid-frequency BPF and low-frequency BPF to the converted voltage and divides the harmonic current into high-frequency harmonic current, mid-frequency harmonic current and low-frequency harmonic current. The high-frequency BPF is a band-pass filter that allows 10 KHz to 5 KHz, for example, to pass. The high-frequency harmonic current that is obtained by passing through the high-frequency BPF includes a harmonic component that is generated particularly by a microwave oven and the like. Moreover, the mid-frequency BPF is a band-pass filter that allows 5 KHz to 2.5 KHz, for example to pass. The mid-frequency harmonic current that is obtained by passing through the mid-frequency BPF includes a harmonic component that is generated particularly by an air conditioner and the like. Furthermore, the low-frequency BPF is a band-pass filter that allows 2.5 KHz to 1.25 KHz, for example to pass. The low-frequency harmonic current that is obtained by passing through the low-frequency BPF includes a harmonic component that is generated particularly by a vacuum cleaner and the like. In this way, the frequencies of the harmonics that are generated by electrical devices differ, so by separating the current according to frequency, it is possible to separate well the characteristics of the harmonics.

Figure 4A:
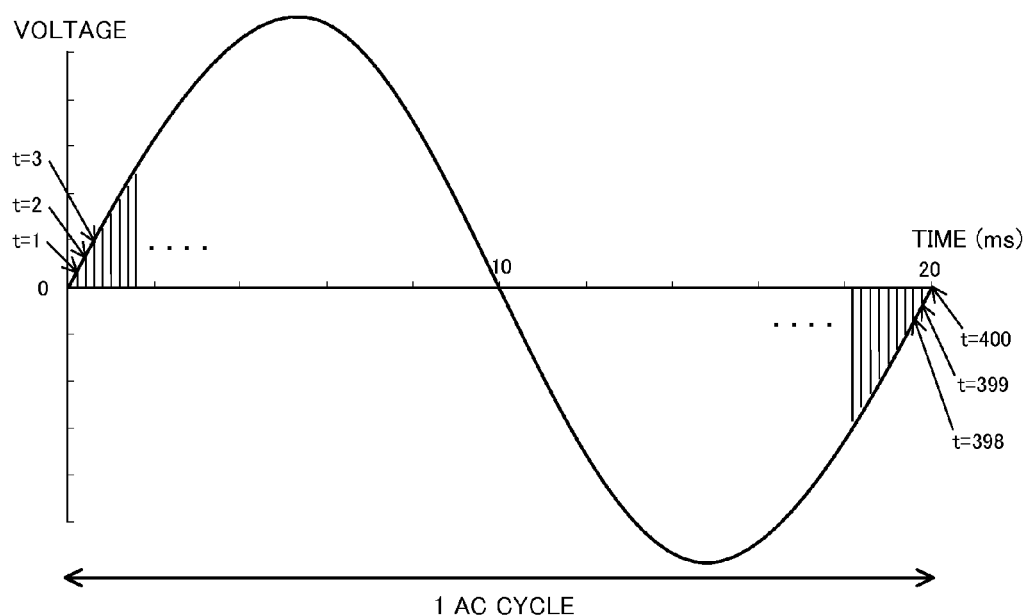
FIG. 4A is a graph for explaining the harmonic current that is measured by the ammeter in FIG. 2, and is a graph illustrating the fundamental frequency component that is removed from a secondary current that was generated by a current sensor.
Figure 4B:
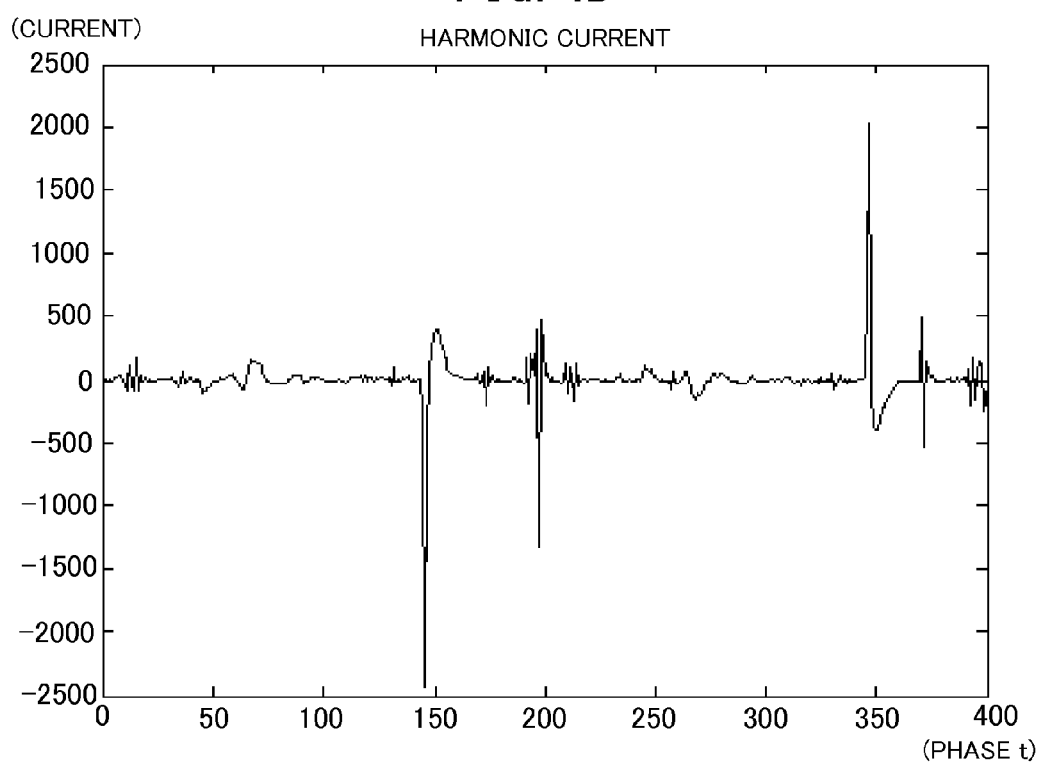
FIG. 4B is a graph for explaining the harmonic current that is measured by the ammeter in FIG. 2; and is a graph illustrating the fundamental frequency component that is removed from the fundamental frequency component.

The ammeter 110 uses the AD converter to convert signals of the three frequency bands that passed through the band-pass filters to digital data. When the sampling rate for the data is set to 20 KHz for example, the ammeter 110, as illustrated in FIG. 4A, performs simultaneous measurement for the time from the zero-cross point where the voltage changes from negative to positive to the next zero-cross point where the voltage changes from negative to positive (performs measurement for 20 milliseconds in regions where the commercial frequency is 50 Hz). The ammeter 110 divides the phase from 0° to 360° into 400 divisions for example, and in the simultaneous measurement, performs measurements for 400 points. As a result, the ammeter 110 is able to acquire a harmonic waveform such as illustrated in FIG. 4B. In order to make the following explanation easier to understand, the first point in the AC cycle is taken to be phase t=1, and the point that is measured last is taken to be phase t=400. In the simultaneous measurement, measurement is performed for 400 points for each of the three frequency bands, so the ammeter 110 is able to acquire measurement data for a total of 1200 points (current values or voltage values) in one measurement. The ammeter 110 continually transmits the acquired data for the 1200 points to the controller 120. The ammeter 110 can also perform measurement each time a zero-cross from negative to positive is detected, or can also perform measurement at specified time intervals. In order to make the explanation below easier to understand, the ammeter 110 measures the harmonic current and transmits the results to the controller 120 at 1-minute intervals.

Returning to FIG. 2, the controller 120 comprises a processing device such as a processor. The controller 120 operates according to a program that is stored in ROM (Read Only Memory) or RAM (Random Access Memory) (not illustrated in the figure), and executes various processing that includes a "measurement data acquisition process", "pattern analysis process" and "fault detection process" that will be described later. By executing the "measurement data acquisition process", "pattern analysis process" and "fault detection process", the controller 120, as illustrated in FIG. 5, functions as a measurement data acquirer 121, a clusterer 122, a pattern analyzer 123, and a fault determiner 124. These functions will be described later in the explanations of the "measurement data acquisition process", "pattern analysis process" and "fault detection process".

Returning to FIG. 2, the communication interface 130 comprises a network connection interface such as a LAN (Local Area Network) device. The communication interface 130, by way of a network such as a LAN (Local Area Network), WAN (Wide Area Network), telephone lines (mobile telephone network, fixed telephone network, and the like), the Internet and the like, transmits various kinds of data such as fault detection results and the like to a monitoring server 200 that is located at a remote location.

The storage 140 comprises a readable/writable storage device such as a DRAM (Dynamic Random Access Memory), SRAM (Static Random Access Memory), flash memory, hard disk and the like. The storage 140 stores various kinds of databases such as a "current measurement database", a "clustering database", an "active determination database", a "pattern determination database" and the like. The contents of these databases will be explained later in the explanations of the "measurement data acquisition process", "pattern analysis process" and "fault detection process".

Next, the operation of a fault detection device 100 having such a construction will be explained.

The controller 120 of the fault detection device 100 simultaneously executes the "measurement data acquisition process", "pattern analysis process" and "fault detection process" by operating according to a multi-process (multi-task) type of operating system. First the "measurement data acquisition process" will be explained.

When the power is turned ON to the fault detection device 100, the controller 120 starts the "measurement data acquisition process". In the following, the "measurement data acquisition process" will be explained with reference to the flowchart in FIG. 6.

The measurement data acquirer 121 of the controller 120 determines whether measurement data for 1200 points (400 points each for low frequency, mid frequency and high frequency) in one AC cycle that was transmitted in 1-minute intervals from the ammeter 110 was acquired (step S101). When measurement data has not been acquired (step S101: NO), the measurement data acquirer 121 repeats step S101 until measurement data is acquired. When measurement data has been acquired (step S101: YES), processing advances to step S102.

The measurement data acquirer 121 adds the "acquisition time", "frequency", and "phase" and creates records for the acquired measurement data of each of the 1200 points, and as illustrated in FIG. 7, registers those records in a current measurement database 141 (step S102). After registration is complete, processing returns to step S101, and waits to receive measurement data again.

Next, the "pattern analysis process" will be explained.

When the power is turned ON to the fault detection device 100, the controller 120 executes the "pattern analysis process". The "pattern analysis process" is executed every other day, for example. In the following, the "pattern analysis process" will be explained with reference to the flowchart in FIG. 8.

The pattern analyzer 123 of the controller 120 determines whether measurement data for a preset fixed period or more has been accumulated in the current measurement database 141 (for example, measurement data for one week or more) (step S210). When measurement data for a fixed period or more has not been accumulated (step S210: NO), the pattern analyzer 123 ends the pattern analysis process. When measurement data for a fixed period or more has been accumulated (step S210: YES), processing advances to step S220.

The phase in which the harmonics easily appear differs for each electrical device. There are electrical devices for which the harmonics easily appear near the peak of the sine wave (in FIG. 4A for example, near the phase t=100, or t=300), and there are also electrical devices for which the harmonics easily appear near the zero-cross from positive to negative (in FIG. 4A for example, near the phase t=200). In other words, the harmonics that electrical devices generate have different frequencies and different phases for each electrical device. By classifying measurement data for each electrical device based on the relationship between the electrical device and the frequency and phase, it is possible to obtain highly accurate analysis results that are equivalent to the analysis results when a measurement device is installed for each electrical device. Therefore, the clusterer 122 of the controller 120 executes a clustering process that classifies measurement data into multiple groups (hereafter, referred to as "clusters") based on frequency and phase information that is correlated with the measurement data (step S220). In the following, the "clustering process" will be explained with reference to the flowchart in FIG. 9.

Figure 10A:
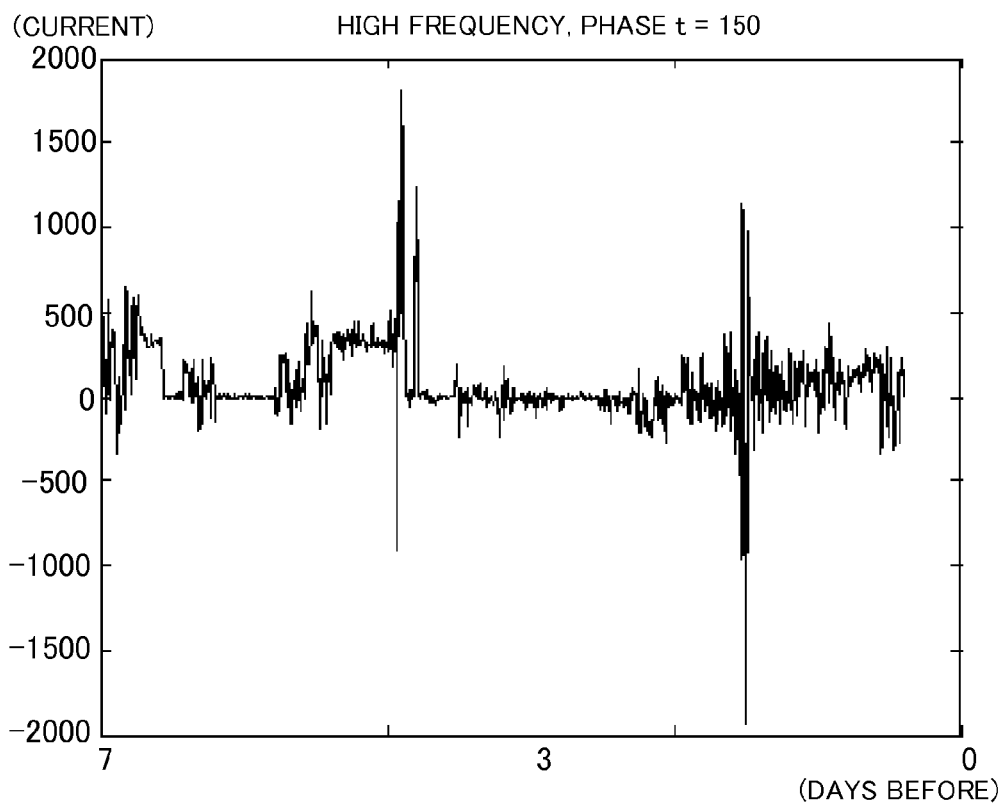
FIG. 10A is a graph for explaining one of multiple classified data strings.
Figure 10B:
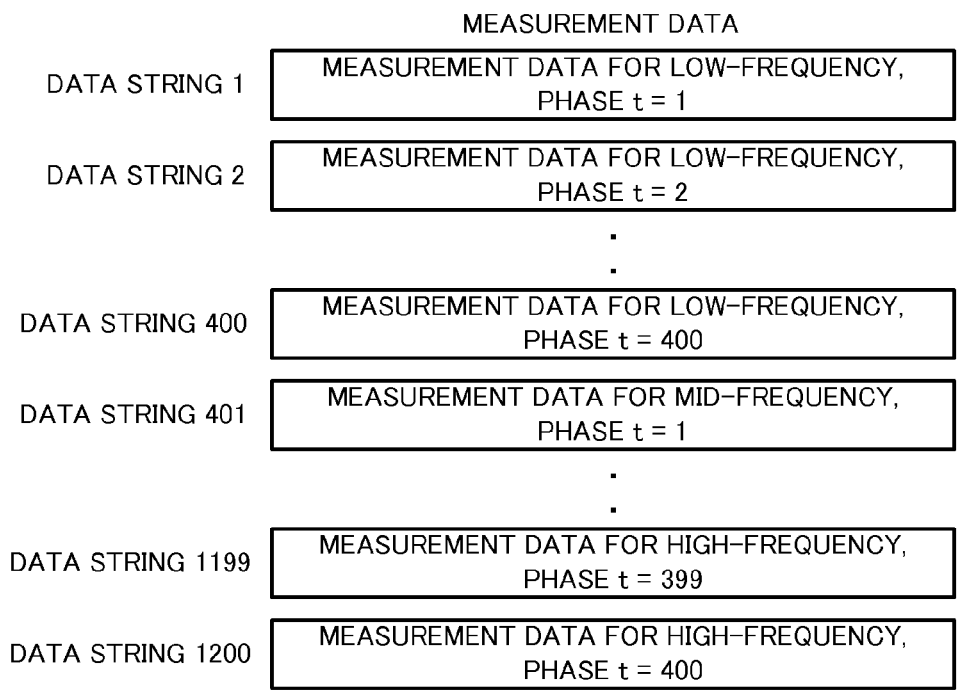
FIG. 10B is a diagram illustrating a state when measurement data is classified into multiple data strings.

The clusterer 122 classifies measurement data for a past fixed period registered in the current measurement database 141 into multiple data strings according to frequency and phase (step S221). In order to more easily understand step S221, FIG. 10A is a graph illustrating an example of one of multiple classified data strings, where the vertical axis is the electrical current, and the horizontal axis is the time (days before). More specifically, FIG. 10A is an example in which a record for which the frequency is "high frequency" and the phase t is "150" is extracted from records for the past one week (seven days of records counting from yesterday) that are registered in the current measurement database 141, and illustrates a data string that is generated by arranging measurement data that is stored in that extracted record in order of acquisition (order of measured time). When measurement data for 1200 points is acquired in one AC cycle, 1200 data strings such as this are generated as illustrated in FIG. 10B.

Figure 9:
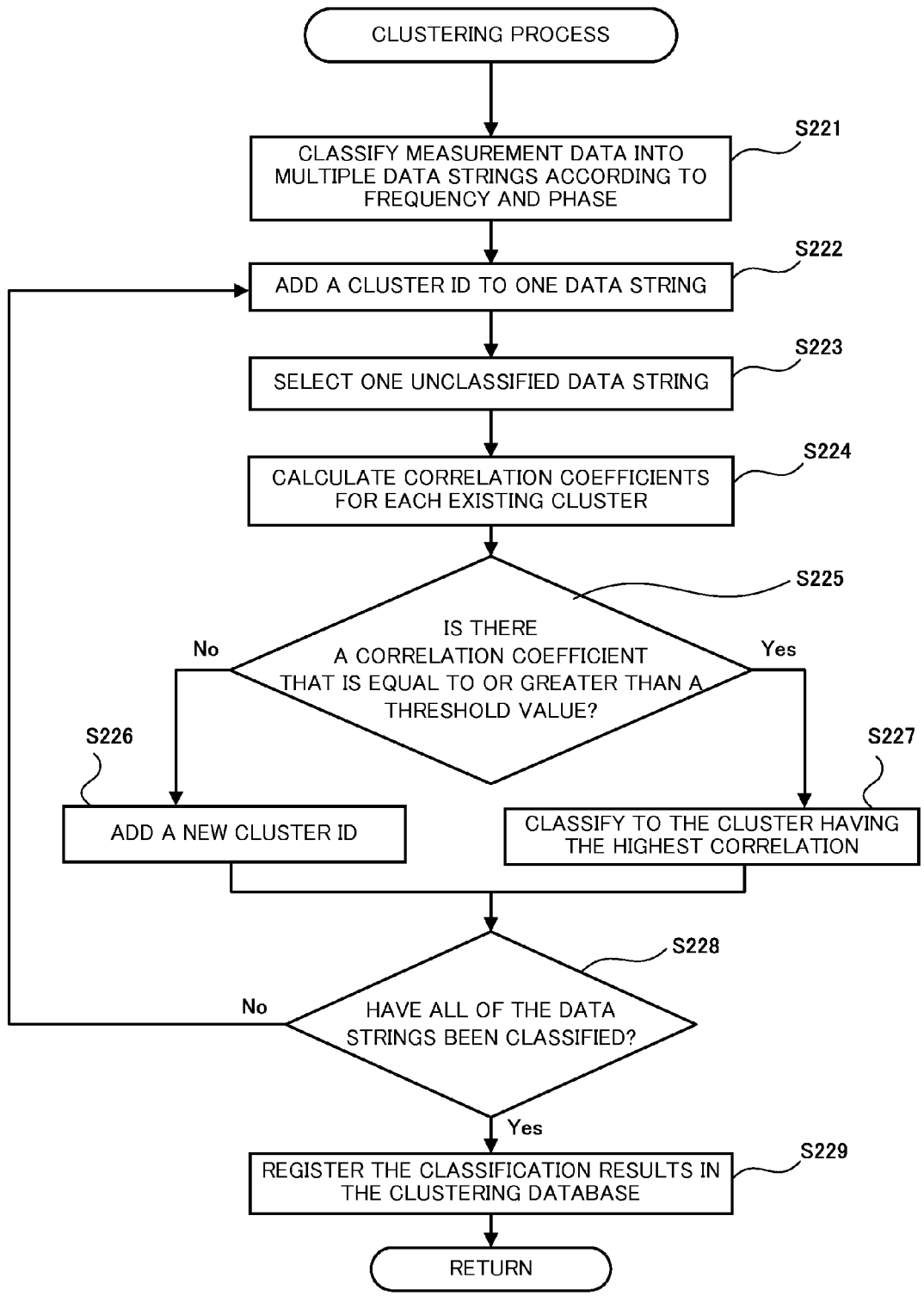
FIG. 9 is a flowchart for explaining a clustering process.

Returning to the flowchart in FIG. 9, the clusterer 122 selects one data string from among the classified multiple data strings, and adds an arbitrary cluster ID (step S222). FIG. 11A is an example in which "data string 1" is selected from among 1200 classified data strings, and "1" is added as a cluster ID.

Returning to the flowchart in FIG. 9, the clusterer 122 selects one data string from among multiple data strings that does not have a cluster ID added (step S223). In the case of the example in FIG. 11B, one data string is selected from among "data string 6" to "data string 1200" to which a cluster ID has not yet been added.

Returning to the flowchart in FIG. 9, the clusterer 122 calculates a correlation coefficient for the correlation between the data string selected in step S223 and cluster strings to which cluster IDs have already been added. When doing this, the clusterer 122 calculates a correlation coefficient for each cluster (step S224). For example, in the example in FIG. 11B, when data string 6 is selected, the clusterer 122 calculates the correlation between one data string from among data strings 1 to 3 to which the cluster ID "1" has been added and data string 6. Furthermore, the clusterer 122 calculates the correlation between one data string selected from among the data strings 4 and 5 to which the cluster ID "2" has been added and data string 6. The clusterer 122 can also calculate a correlation coefficient for the correlation between a data string that is generated by taking the average of data strings to which the same cluster ID has been added and the data string selected in step S223, and in the case where data string 6 is selected in step S223, the clusterer 122 generates a new data string by taking the average of data strings 1 to 3, and calculates a correlation coefficient for the correlation between that generated data string and data string 6. Furthermore, the clusterer 122 generates a new data string by taking the average of data strings 4 and 5, and calculates a correlation coefficient for the correlation between that generated data string and data string 6.

Returning to FIG. 9, the clusterer 122 determines whether there is a correlation coefficient among the calculated correlation coefficients that is equal to or greater than a threshold value (step S225). When there is no correlation coefficient that is equal to or greater than a threshold value (step S225: NO), processing advances to step S226. When there is a correlation coefficient that is equal to or greater than a threshold value (step S225: YES), processing advances to step S227.

When there is no correlation coefficient that is equal to or greater than a threshold value, the clusterer 122 adds a new cluster ID to the selected data string (step S226). For example, in the example in FIG. 11B described above, when none of the data strings with cluster ID "1" or cluster ID "2" has correlation with data string 6 that is equal to or greater than a threshold value, cluster ID "3" is newly added to data string 6.

Returning to the flowchart in FIG. 9, when there is a correlation coefficient that is equal to or greater than a threshold value, the clusterer 122 classifies the selected data string to the cluster having the highest correlation coefficient (step S227). For example, in the example in FIG. 11B described above, when the correlation coefficient for the correlation with cluster ID "1" is the highest, the clusterer 122 adds cluster ID "1" to data string 6. On the other hand, when the correlation coefficient for the correlation with cluster ID "2" is the highest, the clusterer 122 adds cluster ID "2" to data string 6.

Returning to the flowchart in FIG. 9, the clusterer 122 determines whether classification of all of the data strings is finished, or in other words, determines whether cluster IDs have been added to all of the data strings (step S228). When classification of all of the data strings is not finished, (step S228: NO), the clusterer 122 repeats the processing from step S223 to step S228 until classification of all of the data strings is finished. When classification of all of the data strings is finished (step S228: YES), processing advances to step S229.

The clusterer 122 arranges the classification results, and generates a record that correlates the frequency, phase and cluster ID. Then, as illustrated in FIG. 12 for example, the clusterer 122 registers the generated record in a clustering database 142 (step S229). After registration is finished, the clusterer 122 ends the clustering process.

Returning to the flowchart in FIG. 8, the pattern analyzer 123 determines at each time for each classified cluster whether measurement data that is equal to or greater than a threshold value (in other words, harmonic) has appeared (step S230). In order to make the following explanation easier to understand, when a harmonic has appeared, the term "active" will be used, and when a harmonic has not appeared, the term "inactive" will be used. The pattern analyzer 123 determines, active and inactive in the following way, for example.

First, the pattern analyzer 123 extracts measurement data for the same time and same cluster from the current measurement database 141 based on the contents of the clustering database 142. FIG. 13 is an example for making it easier to understand step S230, and illustrates measurement data for cluster ID "7" from among measurement data of three frequency bands that were measured at 8:30 on January 1 (measurement data that is specified by records 11 to 17 illustrated in FIG. 12). The pattern analyzer 123 finds the average value of the absolute values of the extracted measurement data, and determines that the average value is "active" when the average value is equal to or greater than a preset threshold value, and determines that the average value is "inactive" when the average value is less than the threshold value. The pattern analyzer 123 creates a record that correlates the determination results, the cluster ID and the time, and as illustrated in FIG. 14 for example, registers the record in an active determination database 143.

Figure 15:
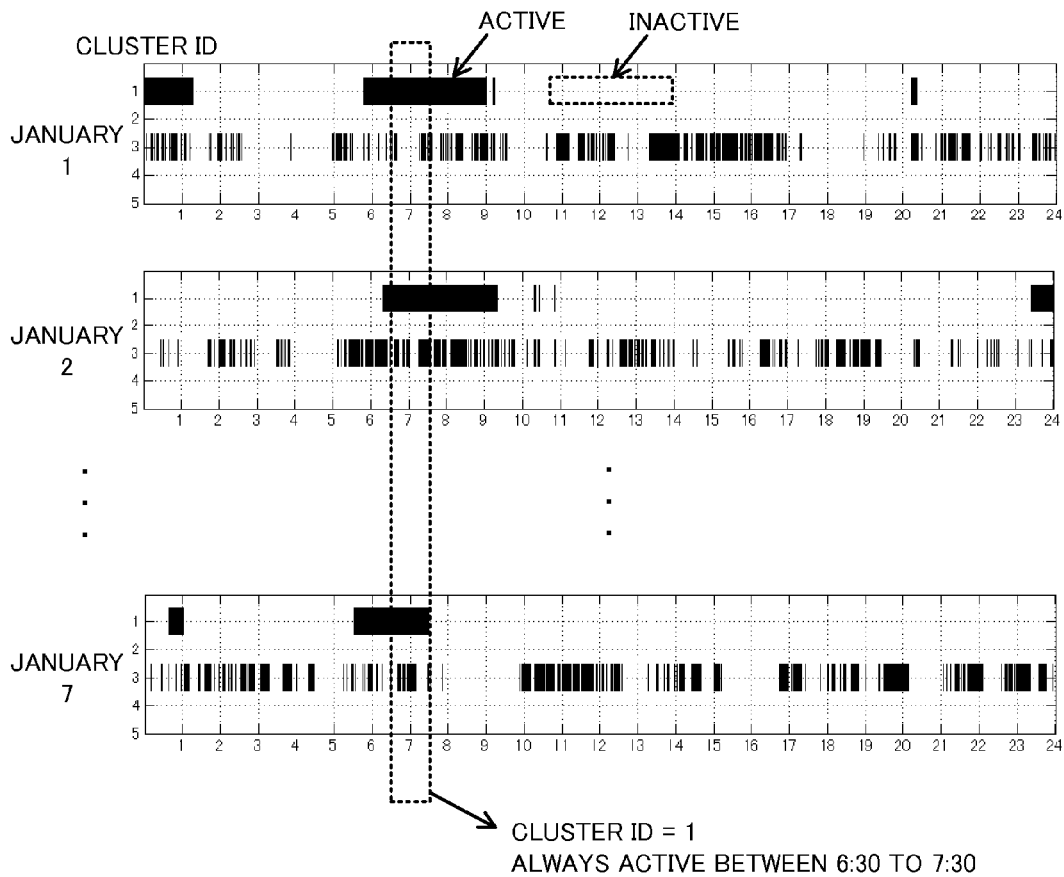
FIG. 15 is a diagram that illustrates the active/inactive determination results for one week for a specific cluster.
Figure 16:
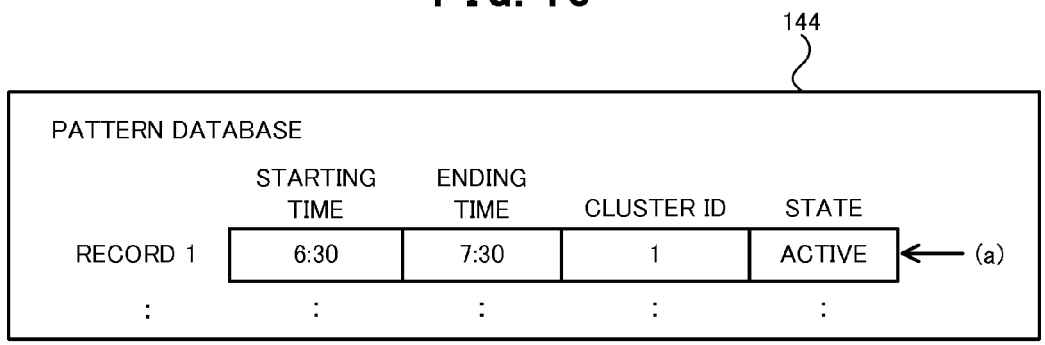
FIG. 16 is a diagram for explaining a pattern database that is stored in the storage that is illustrated in FIG. 2.

Harmonics or noise due to external disturbance occurs singly and not periodically. Harmonics or noise due to the lifestyle of the inhabitant, or in other words, due to the operation of electrical devices by the inhabitant is often repeated over a fixed period (for example, 24-hour period). Therefore, returning to FIG. 8, the pattern analyzer 123, identifies, based on the contents of the active determination database 143, the timing at which a harmonic (in other words measurement data that is determined to be active) appears periodically over a 24-hour period to be a pattern of appearance of a harmonic that is due to the lifestyle of the inhabitant (step S240). FIG. 15 is an example for making it easier to understand the processing of step S240, and illustrates the active/inactive determination results for one week from January 1 to January 7 according to cluster. In this example, cluster ID "1" is always active from 6:30 to 7:30 over the one week period, so the pattern analyzer 123 is able to determine that the electrical device having cluster ID "1" always operates from 6:30 to 7:30 during the day. The pattern analyzer 123 creates a record that indicates the appearance pattern for the determined harmonic, and registers the record in a pattern database 144 as illustrated in FIG. 16, for example. After registration is finished, the pattern analyzer 123 ends the pattern analysis process.

Next, the "fault detection process" will be explained.

When the power is turned ON to the fault detection device 100, the controller 120 starts the "fault detection process". In the following, the "fault detection process" will be explained with reference to the flowchart in FIG. 17.

The fault determiner 124 of the controller 120 determines whether a new record (in other words, measurement data for 400 points each for high frequency, mid frequency and low frequency, or a total of 1200 points) for one AC cycle has been registered in the current measurement database 141 (steps S301). When new measurement data has not been registered (step S301: NO), the fault determiner 124 repeats step S301 until new measurement data has been registered (step S301: YES), and then processing advances to step S302.

The fault determiner 124 acquires the 1200 records that were newly registered in the current measurement database 141 (step S302).

The fault determiner 124 classifies the 1200 acquired records into multiple clusters according to frequency and phase based on the contents of the clustering database 142 (step S303).

Using the same method as in step S230, the fault determiner 124 determines whether each of the classified clusters is active or inactive (step S304).

The fault determiner 124 uses a timer (not illustrated in the figure) for example to identify the current time. Then, the fault determiner 124 extracts all of the records from the pattern database 144 that correspond to the current time (step S305).

Figure 18:
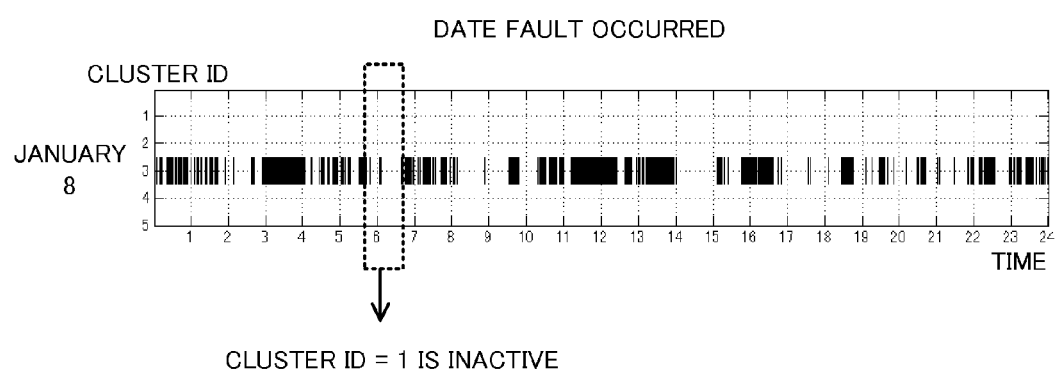
FIG. 18 is a diagram that illustrates the active/inactive determination results for 24 hours for a specific cluster.

The fault determiner 124 determines whether the determination results in step S304 match the harmonic appearance pattern identified by the records extracted in step S305 (step S306). FIG. 18 is an example for making it easier to understand the operation of step S306, and illustrates a collection of active/inactive determination results in step S304 over a 24-hour period. For example, when the current time is 7:00 and the fault determiner 124 has extracted records (a) illustrated in FIG. 16, then the active/inactive determination result at the current time 7:00 in FIG. 18 is "inactive", which is different than the appearance pattern indicated by the extracted records ("active" from 6:30 to 7:30 for cluster ID "1"), so the fault determiner 124 determines that the appearance pattern does not match. When the appearance pattern does not match (step S306: NO), processing advances to step S307. When the appearance pattern matches (step S306: YES), processing returns to step S301.

Figure 17:
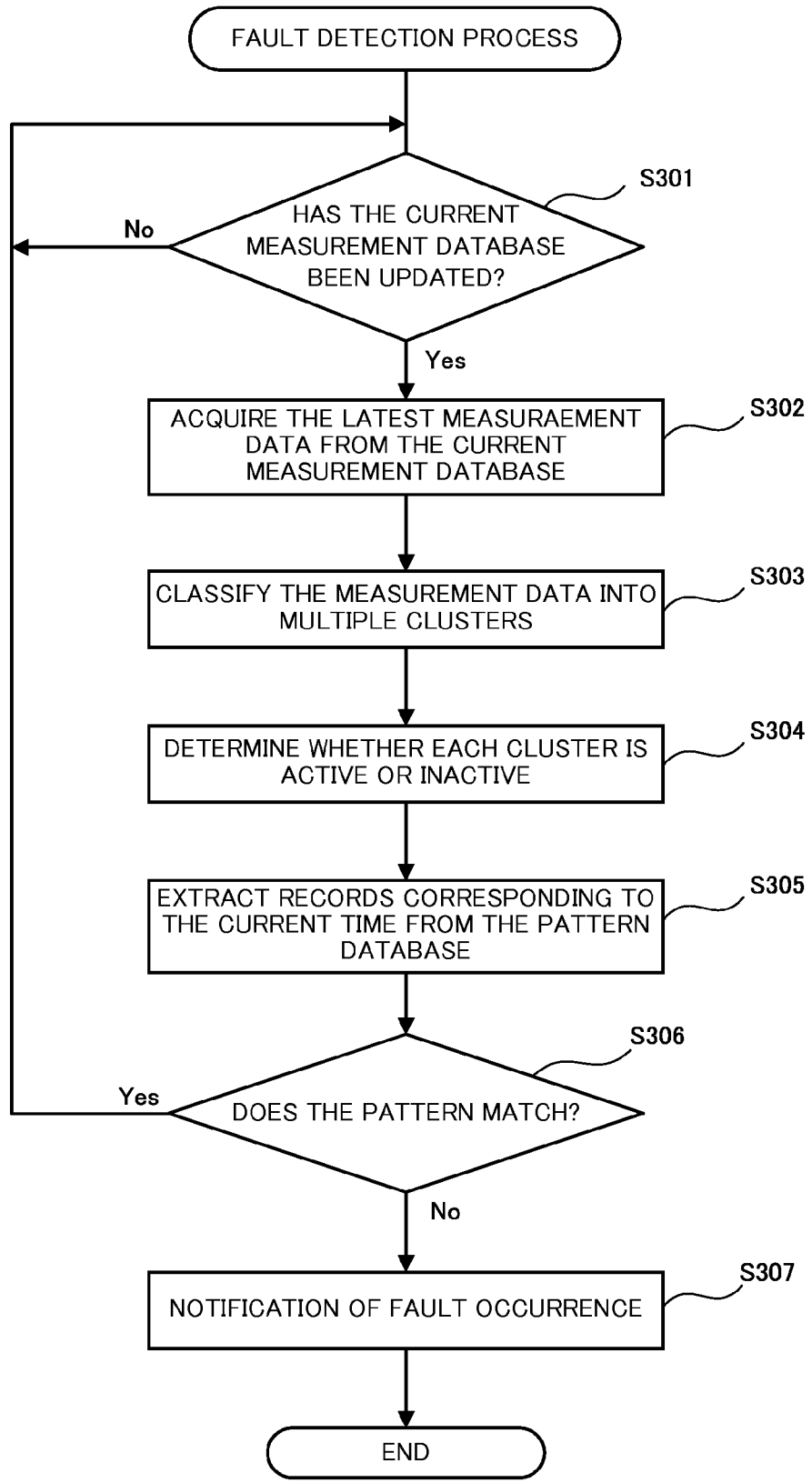
FIG. 17 is a flowchart for explaining a fault detection process.

Returning to the flowchart in FIG. 17, the fault determiner 124 notifies the monitoring server 200 by way of a network that a fault has occurred (step S307). After notification has ended, processing returns to step S301, and waits for the current measurement database 141 to be updated.

Frequencies or phases at which harmonics easily appear differ according to electrical devices. With this embodiment, measurement data is classified into multiple clusters based on frequency and phase, and the appearance patterns of harmonics are analyzed using the classified measurement data, so it is possible to obtain highly precise analysis results that are equivalent to the analysis results when a measurement device is installed for each electrical device in a house. As a result, it is possible to accurately detect when an inhabitant has a problem.

Moreover, in the conventional technology, characteristics of harmonics were analyzed by analyzing the harmonics for each frequency by method such as a Fourier transform method, however, such a method has a large disadvantage in that it is difficult to obtain information in the timeline direction. However, with this embodiment, the characteristics of harmonics are analyzed by analyzing the harmonics for each frequency using three kinds of band-pass filters, so it is possible to make the most of the information in the timeline direction. As a result, it is possible to accurately and in detail assign the type of harmonic (cluster ID), and thus it is possible to obtain accurate appearance pattern analysis results.

Moreover, faults are determined by paying attention to timing (for example, time period) when a specified harmonic occurs regardless of what kind of device for which a harmonic occurred, so it is possible to obtain highly accurate determination results even without following the procedure of "learning device harmonics" that was necessary in the conventional technology.

The embodiment described above is an example, and various modifications and applications are possible.

For example, in the embodiment described above, the ammeter 110 separated current into three frequency bands by using three kinds of band-pass filters, however, the frequency bands for separation are not limited to three, and for example, it is possible to use two, or four or more. Moreover, the filters that are used for separating the current are not limited to being band-pass filters, and for example, the filters could be low-pass filters, or high-pass filters.

Furthermore, the method for separating the current is not limited to a method of using a filter circuit, and for example, separation could be performed by digital signal processing that uses a processor. For example, in the ammeter 110 it is possible for the clusterer 122 of the controller 120 to separate the measurement data into multiple frequency bands without using a filter circuit.

In the embodiment described above, the clusterer 122 classified measurement data of different frequency bands to multiple data strings based on phase, however, the measurement data that is classified, does not necessarily have to be frequency band measurement data. Measurement data that is not separated according to frequency can simply be classified according to phase. Moreover, the clusterer 122 does not necessarily have to classify measurement data based on phase; for example, it is also possible to only separate measurement data according to frequency by digital signal processing. It is possible to obtain analysis results having sufficient accuracy even when the measurement data is classified into multiple clusters based on only the frequency, or based on only the phase.

Moreover, in the embodiment described above, the clusterer 122 classified classified data strings into multiple clusters based on the correlation between data, however, it is also possible to classify all of the classified data strings into different clusters.

The pattern analyzer 123 always identified an active time period in a 24-hour period during as an appearance pattern of a harmonic. However, the pattern analyzer 123 can also identify a time period as an appearance pattern of a harmonic even when there is a day or a part of the time during the time period that is not active. For example, the pattern analyzer 123 acquires all of the active/inactive information of a specified cluster (for example, cluster ID "1") for a specified time period (for example, 6:30 to 7:30) during the past one week from the active determination database 143, and transfers that information to a memory not illustrated in the figure. Then the pattern analyzer 123 calculates the active ratio P by dividing the number of active data transferred to the memory by the total number of data transferred to the memory. Moreover, the pattern analyzer 123 similarly calculates a ratio of the inactive data as the inactive ratio Q. The relationship P+Q=1 is established. Furthermore, when the active ratio P is greater than an active determination threshold value Pth, the pattern analyzer 123 creates a record that correlates the time period, the cluster ID and the state (active) and registers that record in the pattern database 144. When the inactive ratio Q is greater than an inactive determination threshold value Qth, the pattern analyzer 123 creates a record that correlates the time period, the cluster ID and the state (inactive) and registers that record in the pattern database 144.

The appearance pattern that the pattern analyzer 123 identifies does not necessarily have to be a time period every day. For example, the appearance pattern could be a time period on a specified day of the week, or a time period on weekdays or on weekends.

The installation location of the current sensor 111 is not limited to being on the power supply line from the electric supply line service entrance to the power distribution panel. The current sensor 111 could be installed in only a specified power supply system (one of multiple power supply lines that branch out from the power distribution panel), or could also be installed near the electric supply line service entrance on the outside of the house. Moreover, the location where the current sensor 111 is installed is not limited to one location. For example, a current sensor 111 could be installed on all of the multiple power supply lines that branch out from the power distribution panel.

Furthermore, the current sensor 111 is not limited to being a clamp type current sensor, and could be another non-contact type of current sensor such as a Hall current sensor, or a contact-type of current sensor whose terminal makes contact with a power supply line.

The fault detection device 100 of this embodiment can be achieved by a dedicated system, or can also be achieved by a normal computer system. For example, the fault detection device 100 can be constructed by storing a program for executing the operation described above on a computer-readable recording medium and distributing that recording medium, then installing that program onto a computer and executing the processing described above. Moreover, it is also possible to store the program on a disc drive of a server device on a network such as the Internet, and download that program to a computer. Furthermore, the functions described above can also be achieved by sharing between the OS and application software. In that case, only the part other than the OS can be stored and distributed on a medium, or can be downloaded onto a computer.

As the recording medium on which the program is recorded, it is possible to use a USB memory, a flexible disk, a CD (Compact disc), a DVD (Digital Versatile Disc), a Blu-ray Disc (registered trademark), a MO (Magneto-Optical disk), a SD memory card (Secure Digital memory card), a memory stick (registered trademark), a magnetic disk, an optical disk, and magneto-optical disk, a semiconductor memory, a magnetic tape and the like that can be read by a computer.

Various embodiments and variations of the present disclosure are possible within the wide spirit and range of the disclosure. Moreover, the embodiments described above are for explanation of the present disclosure and do not limit the range of the disclosure. In other words, the range of the present disclosure is as presented in the Claims and not the embodiments. Various variations that are within the range of the Claims and within the range of significance of an equivalent disclosure are considered to be within the range of the present disclosure.

This specification claims priority over Japanese Patent Application No. 2012-264369, as filed on Dec. 3, 2012. Japanese Patent Application No. 2012-264369 is included in its entirety in this specification by reference.

INDUSTRIAL APPLICABILITY

The present disclosure can be employed for a fault detection device, fault detection method and program that are capable of accurately detecting when an inhabitant has a problem.

REFERENCE SIGNS LIST

100 Fault detection device
110 Ammeter
111 Current sensor
120 Controller
121 Measurement data acquirer
122 Clusterer
123 Pattern analyzer
124 Fault determiner
130 Communication interface
140 Storage
141 Current measurement database
142 Clustering database
143 Active determination database
144 Pattern database
200 Monitoring server

The invention claimed is:

1. A fault detection device, comprising:
a measurement data acquirer configured to acquire measurement data for current flowing through power supply lines connected to multiple electrical devices;
a clusterer configured to classify the measurement data for a past fixed period into multiple clusters based on at least one of frequency and phase with respect to an AC cycle;
a pattern determiner configured to determine, for each cluster of the multiple clusters, an appearance pattern of the measurement data satisfying a preset standard; and
a fault determiner configured to determine that a fault has occurred to an inhabitant when measurement data additionally acquired does not match the appearance pattern determined by the pattern determiner, wherein
the clusterer separates or classifies the measurement data for the past fixed period based on at least one of frequency and phase with respect to the AC cycle, and classifies the separated or classified data into the multiple clusters based on a correlation of the data, and wherein
the clusterer classifies the measurement data for the past fixed period based on the phase with respect to the AC cycle, and classifies the classified data into the multiple clusters based on the correlation of the data.

2. The fault detection device according to claim 1, wherein
the clusterer classifies the measurement data for the past fixed period based on the phase and the frequency, and classifies the classified data into the multiple clusters based on the correlation of the data.

3. The fault detection device according to claim 1, wherein
the clusterer separates the measurement data for the past fixed period into multiple data based on the frequency, classifies the separated data based on the phase with respect to the AC cycle, and classifies the classified data into the multiple clusters based on the correlation of the data.

4. The fault detection device according to claim 1, wherein
the measurement data is measurement data measured according to the frequency band by separating the current into two or more frequency bands; and
the clusterer classifies the measurement data of each of the frequency bands based on the phase with respect to the AC cycle, and classifies the classified data into the multiple clusters based on the correlation of the data.

5. A fault detection method, comprising:
acquiring measurement data for current flowing on power supply lines connected to multiple electrical devices;

classifying the measurement data for a past fixed period into multiple clusters based on at least one of frequency and phase with respect to an AC cycle;

determining, for each cluster of the multiple clusters, an appearance pattern of the measurement data satisfying a preset standard; and determining that a fault has occurred to an inhabitant when measurement data additionally acquired does not match the appearance pattern, wherein the classifying of the measurement data for the past fixed period is based on the phase with respect to the AC cycle, and the classifying of the classified data into the multiple clusters is based on a correlation of the data.

6. A non-transitory recording medium storing a program allowing a computer to function as:

a measurement data acquirer configured to acquire measurement data for current flowing on power supply lines connected to multiple electrical devices;

a clusterer configured to classify the measurement data for a past fixed period into multiple clusters based on at least one of frequency and phase with respect to an AC cycle;

a pattern determiner configured to determine, for each cluster of the multiple clusters, an appearance pattern of the measurement data satisfying a preset standard; and a fault determiner configured to determine that a fault has occurred to an inhabitant when measurement data additionally acquired does not match the appearance pattern determined by the pattern determiner, wherein the classifying of the measurement data for the past fixed period is based on the phase with respect to the AC cycle, and the classifying of the classified data into the multiple clusters is based on a correlation of the data.

* * * * *